United States Patent [19]
Kerdiya et al.

[11] Patent Number: 5,491,419
[45] Date of Patent: Feb. 13, 1996

[54] ASSEMBLY FOR RAPID AND ACCURATE TESTING OF ENCAPSULATED DEVICES

[75] Inventors: Nidal Kerdiya, Garden Grove; Richard L. Andes, Redondo Beach, both of Calif.

[73] Assignee: Teledyne Industries, Inc., Los Angeles, Calif.

[21] Appl. No.: 134,093

[22] Filed: Oct. 8, 1993

[51] Int. Cl.$^6$ .................... G01R 31/02; G01R 31/327
[52] U.S. Cl. ............................... 324/418; 324/755
[58] Field of Search .................... 324/418, 755

[56] References Cited

U.S. PATENT DOCUMENTS

| | | | |
|---|---|---|---|
| 4,947,111 | 8/1990 | Higman et al. | 324/158 F |
| 4,950,980 | 8/1990 | Pfaff | 429/296 |
| 5,038,101 | 8/1991 | Murphy | 324/158 F |
| 5,170,117 | 12/1992 | Chio | 324/755 |

*Primary Examiner*—Walter E. Snow
*Attorney, Agent, or Firm*—Blakely Sokoloff Taylor & Zafman

[57] ABSTRACT

A relay test assembly constructed of a majority of parts adapted to be injection molded and capable of withstanding large and rapid swings in temperature and humidity. These include a central approximately cylindrical body portion having a plurality of channels running therethrough generally-parallel to the axis of the body portion. The channels provide easy entry to leads of a relay. Each channel includes a spring contact which may be brought to bear against a lead positioned in the channel to provide positive electrical contact to the lead so that connection may be made to sources of potential or current. A second set of contacts surrounds the first set and may be brought to bear against a lead positioned in the channel to provide a second more positive electrical contact to the lead closer to the relay through which testing may be conducted. A sleeve positioned about the body portion is shaped to move the springs into contact with the relay leads and retract the springs.

8 Claims, 5 Drawing Sheets

ASSEMBLY FOR RAPID AND ACCURATE TESTING OF ENCAPSULATED DEVICES

BACKGROUND OF THE INVENTION

1. Field of the Invention

This invention relates to miniature electro-mechanical relays and integrated circuit devices, and more particularly, to apparatus for rapidly and accurately testing such relays and devices in production.

2. History of the Prior Art

Electro-mechanical relays have been used in electronic circuits for as long as such circuits have been manufactured. Such relays utilize a mechanical connector which is opened and closed to make contact between two points in an electronic circuit. Although many such relays have been replaced by electronic switches which may be of microscopic size and thus fit well within modern integrated circuits, many situations exist where the electrical performance of an electro-mechanical relay is superior to that of the electronic switch. For example, an electro-mechanical relay can achieve a flat amplitude response well into the gigahertz frequency range and still have a response down to direct current. The power handling capabilities of an electro-mechanical switch greatly exceed those of electronic switches. For these and many other reasons, electro-mechanical switches are useful in many situations.

Small electro-mechanical relays are often encapsulated in very small housings and are used in various products such as aircraft. Often relays used in these products require significant testing over a wide range of temperature and environmental conditions. The testing of these parts is quite stringent because failure of the relays could have significant effect on the products with which they are used. For example, certain of these relays are tested across temperature ranges which vary from minus 65 degrees centigrade to plus 125 degrees centigrade. Among other things, the relays are tested while being subjected to intense atmospheric moisture. The relays are subjected to a number of tests for periods which extend up to two hours. Other encapsulated electrical devices such as semiconductor devices often must be similarly tested.

In order to test these encapsulated relays, it is necessary to position each relay in some sort of a special test assembly or socket which allows the relays to be isolated in environments in which the test conditions may be applied. These assemblies, like the relays, must be placed in hot and cold atmospheres and immersed in moisture for extended periods while various electrical tests are carried out. The extreme environmental conditions to which these sockets are subjected has caused drastic failure rates. For example, it has been typical for certain sockets to begin failing after as few as forty relays have been tested. Typically, each such test socket has been hand made by a process which requires approximately thirty hours of skilled labor. Since approximately 10,000 relays must be tested each day, the expense of testing and of constructing new sockets has made the relays overwhelmingly expensive.

Recently, a new test assembly has been devised which allows much more rapid and accurate testing of relays and devices which are encapsulated in similar enclosures (e.g., operational amplifiers and other integrated circuit devices). Such an assembly is designed to be easily manufactured by mass production processes, allows easy and rapid loading of devices to be tested, and gives very accurate measurements for test values applied at the base of the test assembly. Such a test assembly is described in detail in U.S. patent application Ser. No. 08/040,529, entitled *Test Assembly For Relay*, A. Sparling et al, filed Mar. 31, 1993, and assigned to the assignee of the present invention. However, because the points at which test instruments may be applied to measure values are at the base of the test assembly, the measurements which are produced include values of resistance, inductance, and capacitance related to the length of the conductive path through the test assembly. The measurements also are affected by the cross sectional dimensions at each connection point between the contacts of the measuring device and those of the device being tested, the length of the leads of the device being tested, and other factors unrelated to the values of the resistance, inductance, and capacitance of the relay or other circuitry residing within the enclosure. For many purposes, it is necessary to provide a very accurate test of such internal device characteristics. For example, various government acceptance tests require that resistance values across the contacts of a relay be less than one-tenth of an ohm when measured at a position one-eighth of an inch from a relay enclosure.

SUMMARY OF THE INVENTION

It is, therefore, an object of the present invention to provide an improved test assembly capable of providing more accurate measurements of the internal electrical values within an outer encapsulation of a relay or other device similarly enclosed.

It is another object of the present invention to provide such a test assembly which is subject to long use under extreme environmental conditions without failure.

These and other objects of the present invention are realized in a relay test assembly constructed of a majority of parts adapted to be injection molded and capable of withstanding large and rapid swings in temperature and humidity. These include a central approximately cylindrical body portion having a plurality of channels running therethrough generally-parallel to the axis of the body portion. The channels provide easy entry to leads of a relay. Each channel includes a spring contact which may be brought to bear against a lead positioned in the channel to provide positive electrical contact to the lead so that connection may be made to sources of potential. A second set of contacts of lower impedance surrounds the first set and may be brought to bear against a lead positioned in the channel to provide a second more positive electrical contact to the lead for testing closer to the relay enclosure. A sleeve positioned about the body portion is shaped to move the testing and the spring contacts into contact with the relay leads and to retract the testing and the spring contacts.

These and other objects and features of the invention will be better understood by reference to the detailed description which follows taken together with the drawings in which like elements are referred to by like designations throughout the several views.

DETAILED DESCRIPTION OF THE INVENTION

Figure 1:
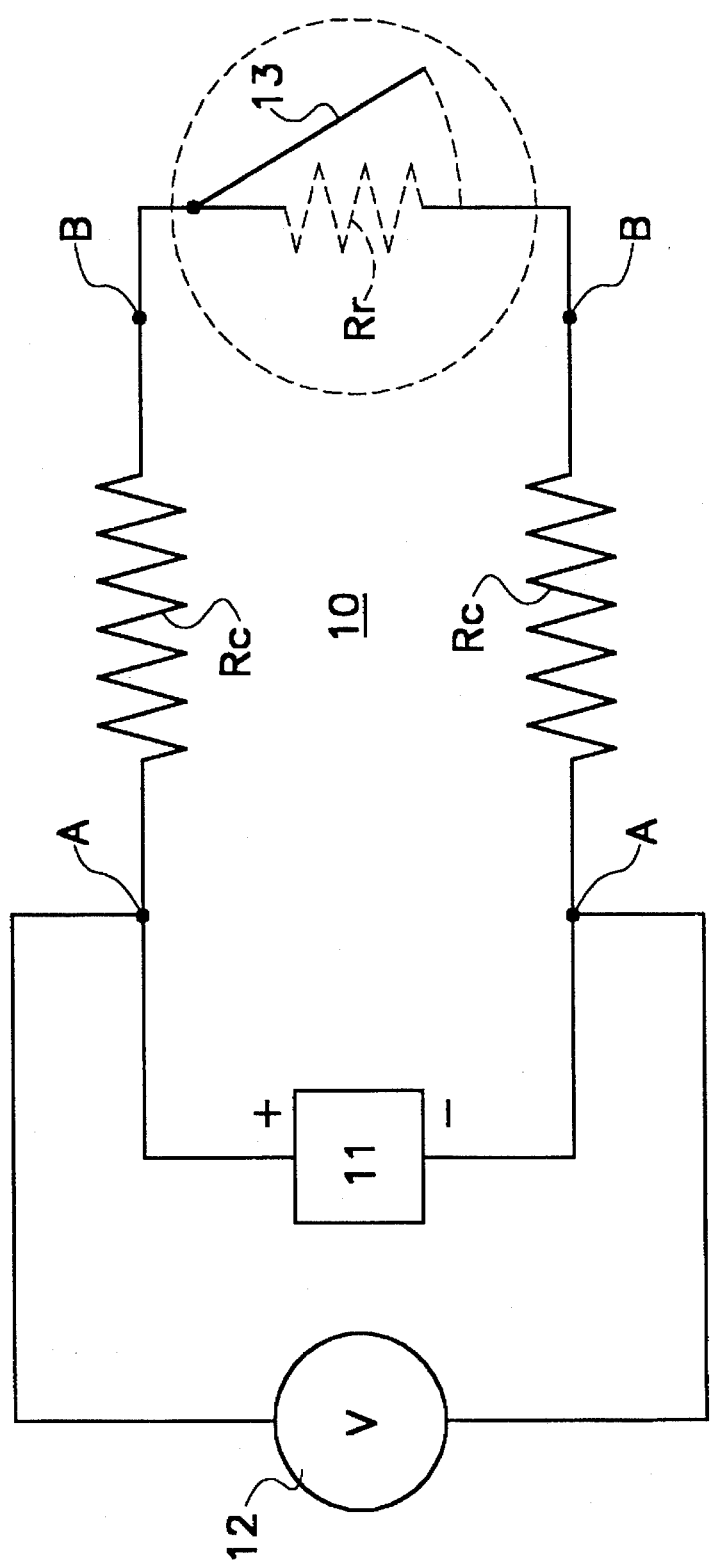
FIG. 1 is a partially-block, partially-circuit diagram of a prior art test assembly illustrating the position at which values are measured in both prior art assemblies and in assemblies constructed in accordance with the present invention.

Referring now to FIG. 1, there is illustrated a partially-block, partially schematic view of a circuit 10 utilized for testing the various electrical values of an encapsulated device such as an electromechanical relay. A source of voltage 11 is applied across a pair of terminals of a relay 13. The relay 13 is illustrated as a switch which may be opened or closed and which exhibits, when closed and conducting, a resistance value Rr. The various testing procedures by which the specifications of a relay such as the relay 13 are determined are designed to measure the value Rr as precisely as possible. To this end, various government testing procedures specify that a test shall be conducted which measures the voltage across the points B—B shown in the figure which must be at a distance of one-eighth of an inch from the external enclosure of the relay 13. The voltage across the relay 13 and the current supplied by the source 11 are measured so that the value Rr may be accurately determined.

Unfortunately, the various test assemblies available prior to the present invention have been unable to provide the accurate measurement required at the specified one-eighth inch distance from the enclosure in which the relay 13 is positioned. A major problem encountered is how to provide accurate measurements at points so close to the relay enclosure when using a mechanical fixture to hold the relay and conduct the tests. For example, the test assembly described in the patent application Ser. No. 08/040,529, entitled *Test Assembly For Relay*, referred to above, measures the voltage at a point (see point A—A in FIG. 1) which is approximately one-half inch from the enclosure. Because the measurement must be taken at this distance from the enclosure of the relay 13, the measurement includes the voltage across various impedances which are shown collectively as the resistances Rc in the figure. These include the resistance, capacitance, and inductance of the leads to the relay, the resistance, capacitance, and inductance of the switches which make contact with the relay leads, and the resistance, capacitance, and inductance of leads in the testing apparatus up to the points A—A. Since the leads of the relay and the contacts of the testing apparatus are quite long and have small cross sections, the resistive, inductive, and capacitive effects are significant. Not only are the voltages produced in testing significantly affected by the various elements connected in the circuit between the points A—A and B—B, but the points of connection of the test leads to the leads of the relays by the test fixture are subject to variation from one lead to the next. Consequently, the cross sectional area through which current flows at the contact point to each lead may vary markedly. Since resistance of a current path varies with the cross sectional area through which current flows, these connections provide a range of resistances from very low to very high thereby drastically affecting the values determined by the measurements. In a mass production situation, this means that a number of relays 13 are rejected even though they may, in fact, meet the desired testing criteria.

To overcome these problems, an improved test assembly has been designed to provide what are referred to in this specification as Kelvin tests, tests designed to determine the resistance of an encapsulated relay at points which are one-eighth of an inch from the enclosure. Such an improved test assembly also provides a much more positive contact point between the leads of the relay and thereby eliminates most of the variations in readings to which the earlier test apparatus were subject.

Figure 2:
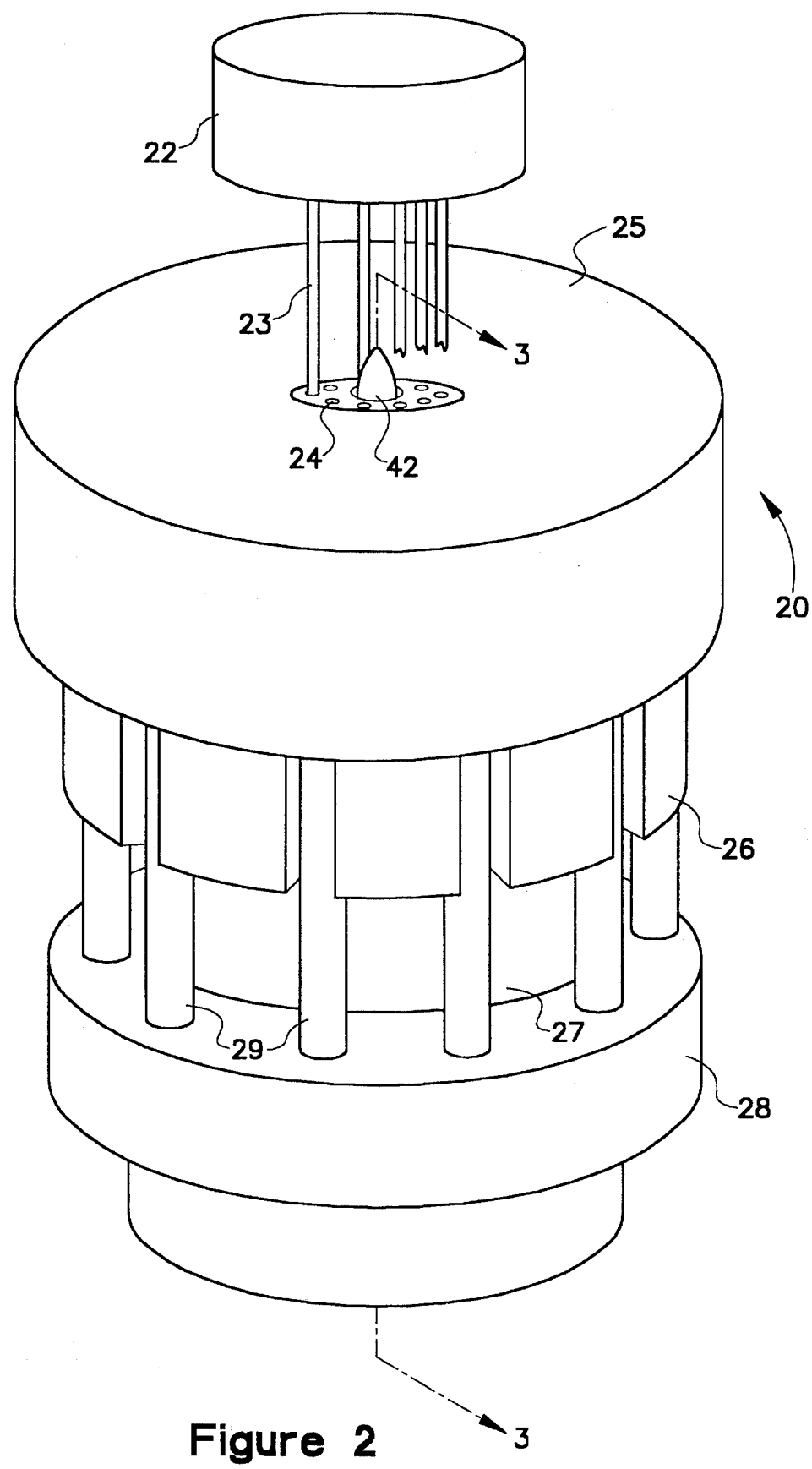
FIG. 2 is a perspective view of a test assembly designed in accordance with the present invention.

FIG. 2 is a perspective view of a test assembly 20 designed in accordance with the present invention. The test assembly 20 is illustrated with an electro-mechanical relay 22 of one type which may be tested positioned above the assembly 20. The relay 22 has a plurality (ten in the embodiment illustrated) of conductors or leads 23 which provide signals to the relay 22. In fact, the relay 22 may include a number of individual relays within its enclosure. These leads 23 are illustrated positioned to be inserted into a plurality of openings 24 in a cylindrically-shaped top body portion 25 of the assembly 20. Below the openings 24 are positioned connectors (not shown in FIG. 2) which are adapted to make electrical connection to the leads 23 placed in the openings 24 so that current may be furnished and the resistance of various elements within the relay 22 may be measured. For example, the leads 23 may make electrical connection to individual ones of a plurality of insulated conductors 29 leading from a base 28 of the assembly 20. In the preferred embodiment of the invention, the base 28 is manufactured of a thermoplastic polyester material such as a material trade named Rynite FR-530 or another named Ultem 1000 which may be injection molded rather than formed by hand to save substantial cost. These materials and the other materials of which the assembly 20 is constructed are able to withstand the extremes of temperature well so that the assemblies 20 will be able to be used to test thousands of relays without structural failure. The base 28 allows the assembly 20 to be mounted to allow the testing of the relay 22 (or other device) which is held by the assembly 20. The conductors 29 may be connected to apparatus for measuring the electrical properties of the circuit elements within the encapsulated portion of the relays 22 in the manner discussed with respect to FIG. 1. Various sources of voltage and current by which the tests on the relays 22 are conducted may also be connected to the relay 22 through conductors which are not illustrated in FIG. 2. Typically, a number of assemblies 20 are mounted to a flat plate (not shown) which forms a door to an interior space within which a desired environment may be produced and maintained.

A hollow generally-cylindrical sleeve 26 fits around the exterior of a cylindrical inner body portion 27 of the base 28 and slides up and down between the top surface 25 and a larger cylindrical outwardly-extending lower portion of the base 28. Like the base 28, the sleeve 26 and the top portion 25 may each be manufactured of a thermoplastic polyester material such as Rynite FR-530 or Ultem 1000.

Figure 3:
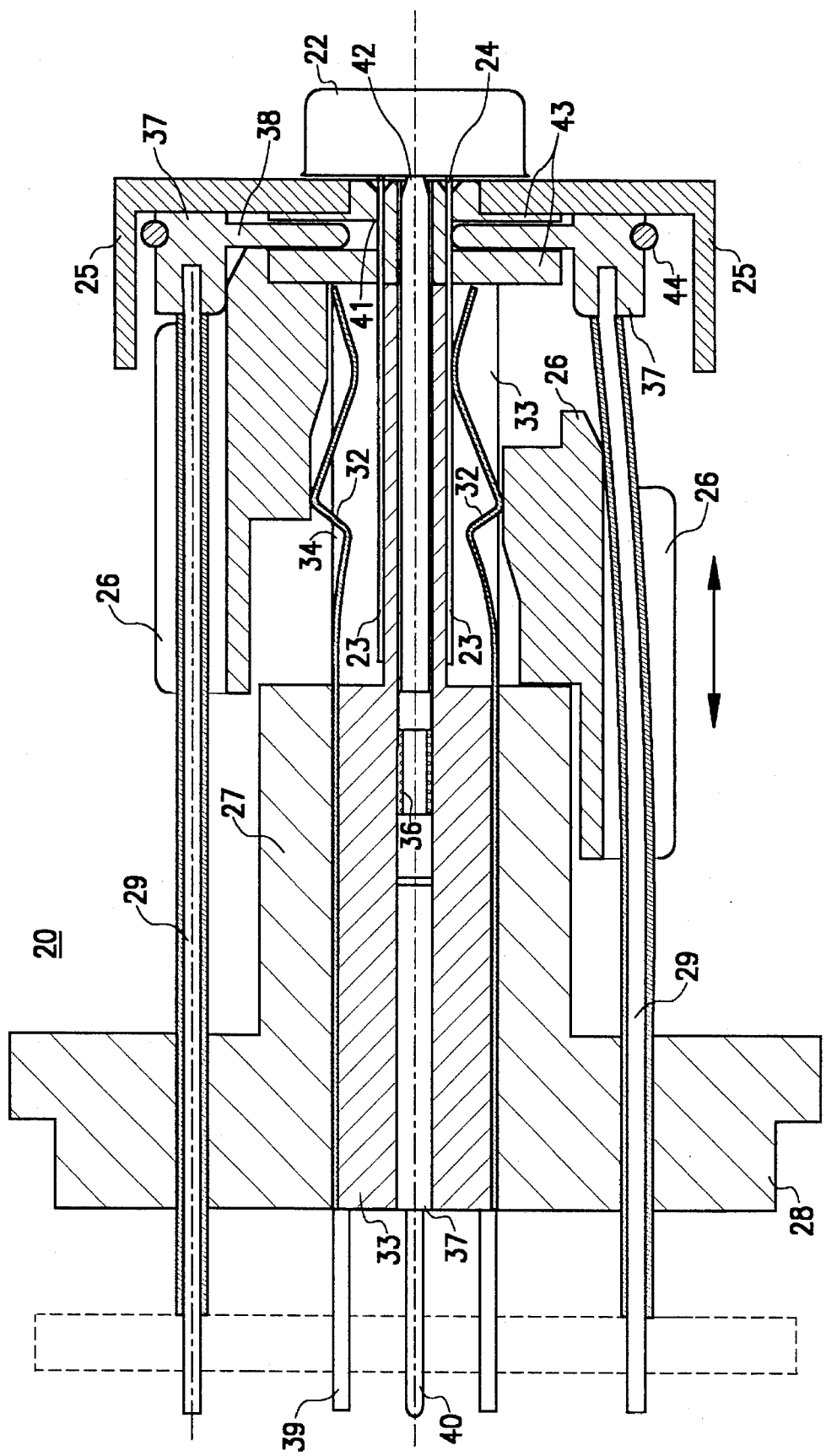
FIG. 3 is a side cross-sectional view of the test assembly illustrated in FIG. 2.
Figure 4:
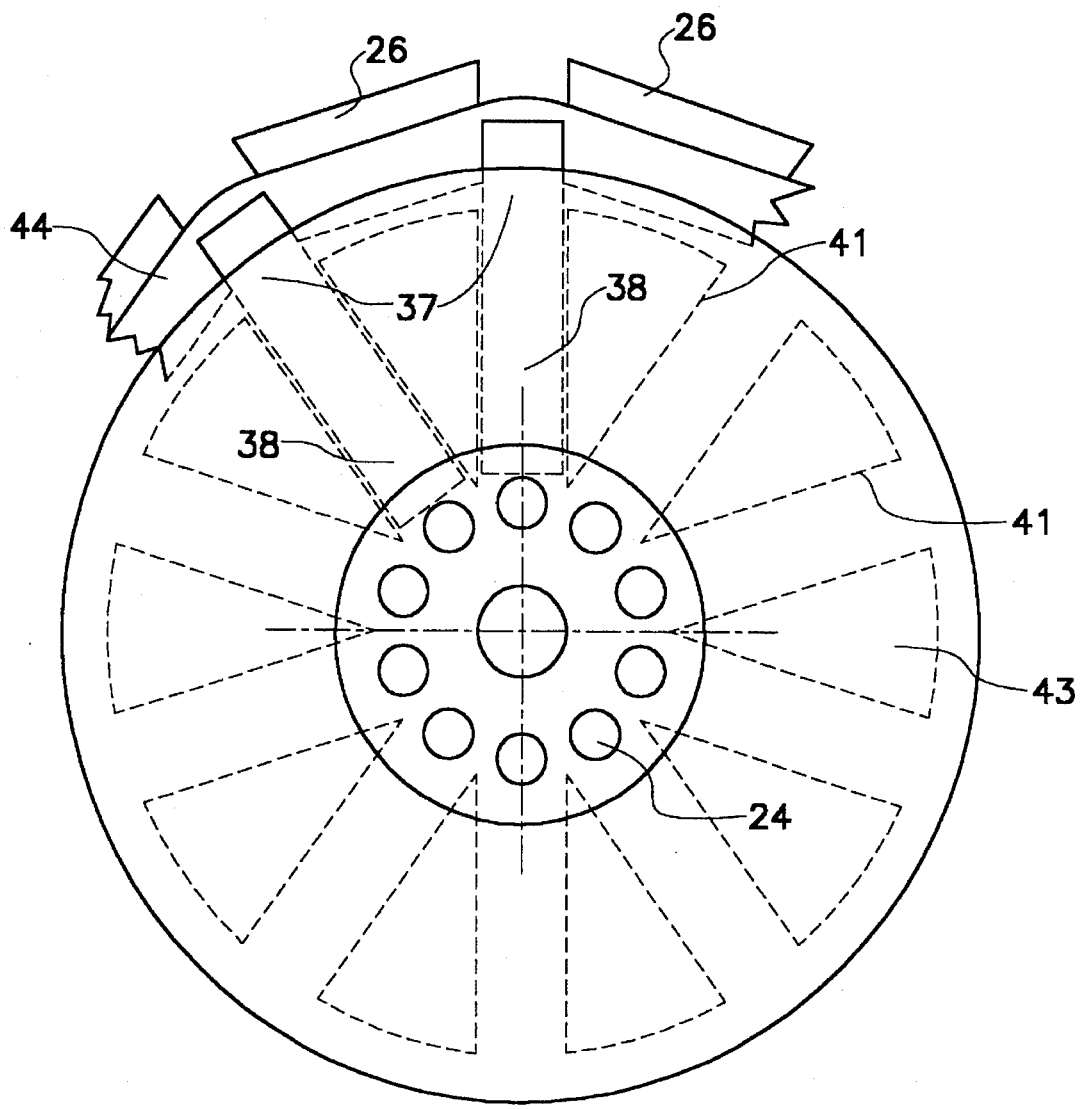
FIG. 4 is an enlarged top view of a portion of the test assembly illustrated in FIG. 2.
Figure 5:
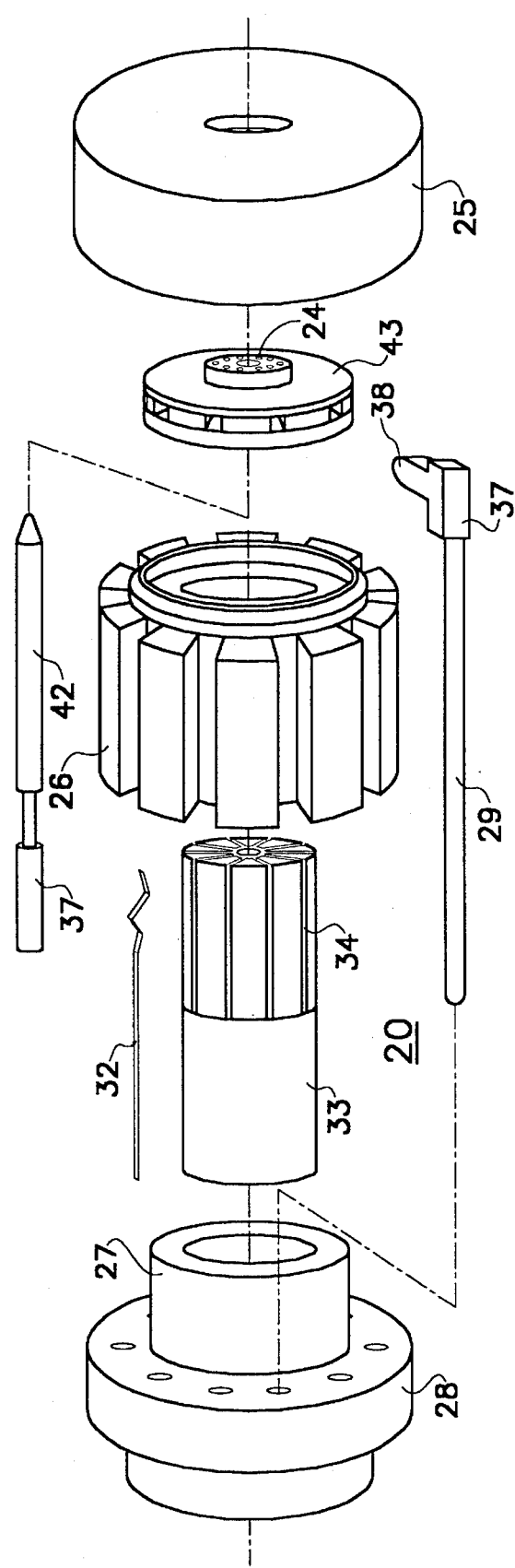
FIG. 5 is an exploded perspective view of the test assembly illustrated in FIG. 2.

FIG. 3 is a cross-section of the assembly 20 taken along the line 3—3 illustrated in FIG. 2. FIG. 4 is an enlarged top view of an interior portion of the assembly 20; and FIG. 5 is an exploded perspective view of the assembly 20. These three figures should be considered together with FIG. 2 to understand the details of the invention. As may be seen, assembly 20 includes a cylindrical central body portion 33 which extends through a hollow cylindrical opening along the central axis of the base 28 and upward toward the top body portion 25. That portion of the central body portion 33 which projects from the base 28 has a plurality of channels 34 (each having a flat bottom and essentially parallel sides)

which radiate outward from its central axis. Like the base 28, in the preferred embodiment of the invention, the central body portion 33 is manufactured of a thermoplastic polyester material such as a material trade named Rynite FR-530 or another named Ultem 1000 which may be injection molded. Positioned in each of these channels 34 is a free end of one of a plurality of generally-flat thin spring contacts 32. Each spring contact 32 may be manufactured of a material such as a beryllium copper alloy well known to those skilled in the art which is adapted to exert a constant spring force over a wide range of temperatures without being subject to corrosion. The other end of each of the spring contacts 32 is held tightly between an inner cylindrical surface of the body portion 27 and the outer cylindrical surface of the central body portion 33 so that the free end of each of the spring contacts is able to move toward and away from the axis of the central body portion 33 in its associated channel 34. In one embodiment of the invention, a slight groove (not shown) may be formed in the outer surface of the central body portion to assist in positioning the spring contact 32 between the inner cylindrical surface of the body portion 27 and the outer cylindrical surface of the central body portion 33. The fixed end of the spring contact 32 may project from the base of the assembly 20 and provide a terminal 39 to which electrical connections may be made. As may be seen, the free end of each spring contact 32 is bent in a shape which has a portion projecting sharply outward from the axis of the central body portion and a portion nearer the free end which projects inwardly toward the axis of the central body portion.

Surrounding the channels 34 of the central body portion 33 is the hollow and generally-cylindrical sleeve 26. The sleeve 26 has an inner cylindrical surface which has a plurality of diameters. At its upper end toward the top of the assembly 20, the inner surface has a smaller diameter; this smaller diameter just fits around the outer surface of the upper portion of the central body portion 33 containing the channels 34. This smaller diameter gradually slopes to a larger diameter in the direction of the bottom of the assembly 20. Finally, at the lowest end, the sleeve 26 has an inner diameter which just fits around the body portion 27 of the base 28.

In an upward position of the sleeve 26 (shown in the upper half of FIG. 3), the middle diameter of the inner surface of the sleeve 26 bears upon and exerts a slight force on the outwardly extending point of the spring contacts 32 within the channels 34. At this position of the sleeve 26, the contacts 32 remain withdrawn from the leads 23 so that the leads 23 may be easily inserted within the openings 24 and into the channels 34 without requiring any insertion force which might scratch the spring contacts 32 or scratch or bend the leads 23 and cause differing contact surfaces.

When the sleeve 26 is moved along its central axis toward the bottom of the assembly 20 to the position shown in the lower half of FIG. 3, the outwardly-projecting portion of each spring contact 32 is forced inwardly by the smallest diameter portion of the inner surface of the sleeve 26 so that the inwardly-projecting point of each contact 32 is brought into tight contact with one of the leads 23 of the relay 22. In this position, each contact 32 provides an electrical path which may end at a terminal 39 projecting from the base of the assembly 20. Various sources of voltage and current may be applied at the terminals 39 so that measurements of the electrical properties of the relay 22 may be made during testing.

When the lower base of the enclosure of the relay 22 is forced against the upper surface of the upper body portion 25, the lower surface of the enclosure forces a spring-mounted contact 42 positioned in a hollow central channel within the central body portion 33 downward into the central channel against the pressure exerted by a spring 36. The spring 36 fits within the channel and forces the contact 42 upwardly toward the upper surface of the top portion 25. Positioning the spring 36 is a cylindrical conductor 37 which joins a terminal 40 projecting from the bottom of the base 28. The contact 42 (which is preferably constructed of stainless steel) rides in a fixed tube (which is preferably also constructed of stainless steel) and provides an electrical path which connects to the conductor 40 projecting from the base of the assembly 20 by which electrical values may be applied so that measurements of the electrical properties of the relay 22 may be made during testing. The tube is fixed into a cylindrical channel through the central body portion 33 of the assembly 20.

However, as may be discerned from FIG. 3, the connections made to the leads 23 of the relay 22 by the spring contacts 32 are subject to variation because of the length and thinness of the spring contacts 32. Moreover, the electrical potentials are applied at the base of the assembly 20 so that the relatively thin contacts 32 provide a significant amount of impedance which will be measured in any readings taken through the contacts 32 at the base of the assembly 20. Consequently, the assembly 20 of the invention includes a second set of electrical contacts through which measurements of the electrical properties of the relay 22 may be taken. These contacts are provided through the very large insulated conductors 29 which are held firmly in place by the base 28. The conductors 29 may be made of twenty gauge copper bus wire and surrounded by a Teflon tubing in the preferred embodiment of the invention. The free ends of the conductors lie in a second set of parallel-sided channels in the outer surface of the sleeve 26. The free end of each conductor 29 connects to a head 37. The head 37 is made of a material such as hard copper and has a projection 38 which extends inwardly toward the axis of the assembly 20. Each projection 38 is formed to move freely in one of a number of slots 41 in an upper cylindrically shaped disk 43; the slots 41 radiate outward from the center of the disk 43 and provide a free path so that the projections 38 of the heads 37 may each be brought in contact with a lead of the relay 22. Like the base 28, in the preferred embodiment of the invention, the disk 43 is manufactured of a thermoplastic polyester material such as Rynite FR-530 or Ultem 1000 which is smooth and allows the projections 38 to slide easily in the slots 41.

In the upward position of the sleeve 26, an inwardly-facing surface of the head 37 rides against the upper diameter of the sleeve 26. In this position of the head, the projection 38 cannot touch the lead 23. The projections 38 remain withdrawn from the leads 23 so that the leads 23 may be easily inserted within the openings 24 and into the channels 34 without requiring any insertion force which might scratch the surface of the projections 38 or scratch or bend the leads 23 and cause differing contact surfaces. When the sleeve 26 is moved to the lower position, an elastic ring 44 retained in a groove in the outer surface of each head 37 and encircling all of the heads 37 forces each of the heads inward. The retracting of the sleeve 26 provides room for the conductors 29 carrying the heads 37 and the projections 38 to move into positions where the projections press forcefully against the leads 23 to make a very positive contact.

It will be noticed that each projection 38 contacts the associated lead 23 across a broad surface at a distance of one-eighth inch from the base of the container of the relay 22 in the preferred embodiment of the assembly. Thus a measuring path is established through the closed relay and its one-eighth inch leads 23 continuing through the heads 37 and the conductors 29 to provide testing paths for the relay. Compared to the large current paths furnished by the contacts 32, the essentially infinite resistance provided by measuring devices such as voltmeters which may be connected to the measuring paths through the conductors 29 at the base of the assembly 20 means that no current flows through the measuring path, and no voltage drop other than that of the relay itself is measured in the measuring path. Moreover, since the conductors are insulated, any inductive or capacitive effects on the conductors 29 are minimized. Consequently, measurements may be made utilizing the paths through the conductors 29 and the heads 37 to the connection points just adjacent the points at which the leads enter the container which encapsulates the relay 22. This allows the very accurate measurements necessary to provide the electrical properties desired according to the above-mentioned testing specifications.

As has been explained above, in the upper position of the sleeve 26, both the spring contacts 32 and the projections 38 are withdrawn from contact with the leads 23 of the relay 22. Consequently, in this position of the sleeve 26, the relay leads 23 may be easily inserted into the assembly 20. When the sleeve 26 is moved to its lower position, each of the spring contacts 32 and the projections 38 move into contact with the associated one of the leads 23 of the relay 22. The current produced by the voltage source 11 may then be applied through selected ones of the spring contacts 32 while measurements are taken through the conductors 29 and the heads 37 to a point on each lead 23 which is one-eighth of an inch (or other specified distance from the enclosure of the relay 22.

It should be noted that the materials of which the assembly 20 of the present invention are constructed are not subject to breakage after being exposed to heat and cold, as were materials previously used to manufacture such parts. Since this breakage made it very difficult to insert the leads 23 into the channels 34, the time required to accomplish the insertion operation has been reduced from approximately ten seconds per relay to approximately three seconds per relay using the present invention. Since thousands of relays are mounted in test assemblies each day, the savings in labor costs are very great using the assemblies of the present invention.

Although the present invention has been described in terms of a preferred embodiment, it will be appreciated that various modifications and alterations might be made by those skilled in the art without departing from the spirit and scope of the invention. For example, the testing arrangement of the present invention can be used to apply similar tests to semiconductor devices housed in enclosures similar to those used for electro-mechanical relays. The invention should therefore be measured in terms of the claims which follow.

What is claimed is:

1. A test assembly for encapsulated electrical devices comprising
    a generally-cylindrical body portion,
        the body portion containing a plurality of channels extending in a direction paralleling a cylindrical axis of the body portion through the body portion from one end of the body portion toward an opposite end,
    conductive terminals extending outward from the body portion,
    a first plurality of spring contacts, one spring contact positioned in each of the channels providing a conductive path to one of the conductive contacts,
    a second plurality of spring contacts, each of the second plurality of spring contacts providing a measuring path to one of the conductive contacts for a high impedance testing device, and
    means for urging each of the first plurality of spring contacts and each of the second plurality of spring contacts into conductive contact with a lead from any encapsulated electrical device placed in a channel, the first plurality of spring contacts adapted to contact a lead at a first distance from the device, and the second plurality of spring contacts adapted to contact a lead at a second distance from the device.

2. A test assembly for encapsulated electrical devices comprising
    a generally-cylindrical body portion,
        the body portion containing a plurality of channels extending in a direction paralleling a cylindrical axis of the body portion through the body portion from one end of the body portion toward an opposite end,
    conductive terminals extending outward from the body portion,
    a first plurality of spring contacts, one spring contact positioned in each of the channels providing a conductive path to one of the conductive contacts,
    a second plurality of spring contacts, each of the second plurality of spring contacts providing a measuring path which may be connected to one of the conductive contacts to a provide a measuring path for a high impedance testing device, and
    means for urging each of the first plurality of spring contacts and each of the second plurality of spring contacts into conductive contact with a lead from any encapsulated electrical device placed in a channel, the first plurality of spring contacts adapted to contact a lead at a first distance from the device, and the second plurality of spring contacts adapted to contact a lead at a second distance from the device,
        the means for urging each of the first plurality of spring contacts and each of the second plurality of spring contacts into conductive contact with a lead from any encapsulated electrical device placed in a channel comprising:
        a sleeve positioned around the body portion in sliding relationship therewith.
        the sleeve having an inner surface adapted to contact a portion of each of the first plurality of spring contacts and urge each such spring contact inwardly in one position and to allow each spring contact to relax in another position,
        the sleeve having an outer surface adapted to retract each of the second plurality of spring contacts from contact with a lead in one position and allow each of the second plurality of spring contacts to move into conductive contact with a lead in another position, and
    means for urging the second plurality of spring contacts toward the channels.

3. A test assembly for encapsulated electrical devices as claimed in claim 2 in which the means for urging the second plurality of spring contacts toward the channels comprises an elastic ring.

4. A test assembly for encapsulated electrical devices as claimed in claim 1 in which the body portion and the means for urging each of the first plurality of spring contacts and each of the second plurality of spring contacts into conductive contact with a lead from any encapsulated electrical device placed in a channel are manufactured of a thermoplastic polyester material.

5. An encapsulated electrical device comprising a generally-cylindrical body portion manufactured of a material generally impervious to extreme variations in temperature, the body portion containing a plurality of channels extending in a direction generally parallel to a cylindrical axis of the body portion through the body portion from one end of the body portion toward the other end, each of the channels being shaped to receive a lead from an encapsulated device to be tested;

a spring contact held in each of the channels providing a conductive path to the other end of the body portion;

the spring contact having a portion extending into the opening to the outer cylindrical surface of the body portion;

a plurality of conductors surrounding the spring contacts and held in positions adjacent each of the channels; and means for urging the spring contact in each of the channels and one of the plurality of conductors adjacent each of the channels into conductive contact with a lead from any encapsulated electrical device placed in a channel.

6. A test assembly for encapsulated electrical devices Comprising a generally-cylindrical body portion manufactured of a material generally impervious to extreme variations in temperature, the body portion containing a plurality of channels extending in a direction generally parallel to a cylindrical axis of the body portion through the body portion from one end of the body portion toward the other end, each of the channels being shaped to receive a lead from an encapsulated device to be tested;

a spring contact held in each of the channels providing a conductive path to the other end of the body portion;

the spring contact having a portion extending into the opening to the outer cylindrical surface of the body portion;

a plurality of conductors surrounding the spring contacts and held in position adjacent each of the channels; and means for urging the spring contact in each of the channels and one of the plurality of conductors into conductive contact with a lead from any encapsulated electrical device placed in a channel the means for urging the spring contact in each of the channels and one of the plurality of conductors into conductive contact with a lead from any encapsulated electrical device placed in a channel comprising a sleeve positioned around the body portion in sliding relationship therewith, the sleeve having an inner surface adapted to contact a portion of each spring contact within the opening to the outer cylindrical surface of the body portion and urge each spring contact inwardly in one position and to allow each spring contact to relax outwardly in another position, the sleeve having an outer surface adapted to contact a portion of each one of the plurality of conductors and urge each one of the conductors outwardly in one position and to allow each one of the plurality of conductors to relax inwardly in another position; and means for urging each one of the conductors inwardly.

7. A test assembly for encapsulated electrical devices as claimed in claim 6 in which the means for urging each one of the conductors inwardly comprises an elastic ring.

8. A test assembly for encapsulated electrical devices as claimed in claim 6 in which the body portion and the sleeve are manufactured of a thermoplastic polyester material.

* * * * *